United States Patent
Guo et al.

(10) Patent No.: US 9,907,204 B2
(45) Date of Patent: Feb. 27, 2018

(54) HEAT DISSIPATION DEVICE AND WORKING METHOD THEREOF, DISPLAY DEVICE

(71) Applicants: BOE TECHNOLOGY GROUP CO., LTD., Beijing (CN); BEIJING BOE MULTIMEDIA TECHNOLOGY CO., LTD., Beijing (CN)

(72) Inventors: Naijia Guo, Beijing (CN); Jianzi He, Beijing (CN)

(73) Assignees: BOE TECHNOLOGY GROUP CO., LTD., Beijing (CN); BEIJING BOE MULTIMEDIA TECHNOLOGY CO., LTD., Beijing (CN)

(*) Notice: Subject to any disclaimer, the term of this patent is extended or adjusted under 35 U.S.C. 154(b) by 80 days.

(21) Appl. No.: 14/910,850

(22) PCT Filed: Sep. 11, 2015

(86) PCT No.: PCT/CN2015/089444
§ 371 (c)(1),
(2) Date: Feb. 8, 2016

(87) PCT Pub. No.: WO2016/155247
PCT Pub. Date: Oct. 6, 2016

(65) Prior Publication Data
US 2017/0042062 A1 Feb. 9, 2017

(30) Foreign Application Priority Data
Mar. 31, 2015 (CN) .......................... 2015 1 0150329

(51) Int. Cl.
*H05K 5/00* (2006.01)
*H05K 7/20* (2006.01)

(52) U.S. Cl.
CPC ....... *H05K 7/20209* (2013.01); *H05K 5/0017* (2013.01); *H05K 7/20136* (2013.01); *H05K 7/20927* (2013.01)

(58) Field of Classification Search
CPC ............ H05K 5/0017; H05K 7/20136; H05K 7/20209; H05K 7/20927
See application file for complete search history.

(56) References Cited

U.S. PATENT DOCUMENTS

2004/0228091 A1* 11/2004 Miyairi .............. H05K 7/20209
361/695
2008/0024983 A1* 1/2008 Anderl ............... H05K 7/20727
361/695
(Continued)

FOREIGN PATENT DOCUMENTS

CN 102486181 A 6/2012
CN 103793014 A 5/2014
(Continued)

OTHER PUBLICATIONS

First Office Action regarding Chinese application No. 201510150329.0, dated Dec. 5, 2016. Translation provided by Dragon Intellectual Property Law Firm.
(Continued)

*Primary Examiner* — Jennifer L Norton
(74) *Attorney, Agent, or Firm* — Harness, Dickey & Pierce, P.L.C.

(57) ABSTRACT

The present disclosure provides a heat dissipation device, a working method thereof and a display device. The heat dissipation device is applied to a display device, including a temperature monitoring unit, configured to monitor an environment temperature of each predetermined region of the display device; a control unit, connected to the temperature monitoring unit, configured to determine regions to be cooled according to a monitoring result of the temperature
(Continued)

monitoring unit and then send a control instruction to a movement unit; the movement unit, connected to the control unit, and configured to move at least one heat dissipation fan to the regions to be cooled in response to the received control instruction; and the at least one heat dissipation fan connected to the movement unit.

19 Claims, 2 Drawing Sheets

(56) References Cited

U.S. PATENT DOCUMENTS

| | | | | |
|---|---|---|---|---|
| 2008/0165482 A1* | 7/2008 | Kim | ........ | G09G 5/003 361/679.21 |
| 2011/0245976 A1* | 10/2011 | Thompson | ........ | G06F 1/206 700/275 |
| 2012/0078420 A1* | 3/2012 | Jensen | ........ | G05B 11/16 700/275 |
| 2013/0018523 A1* | 1/2013 | Rubenstein | ........ | G05D 23/1919 700/300 |
| 2013/0147411 A1* | 6/2013 | Pang | ........ | H05K 7/20209 318/452 |
| 2014/0054024 A1* | 2/2014 | Chen | ........ | H05K 7/20209 165/247 |
| 2014/0111939 A1* | 4/2014 | Lin | ........ | H05K 7/20172 361/695 |
| 2016/0183406 A1* | 6/2016 | Ragupathi | ........ | H05K 7/20209 700/282 |

FOREIGN PATENT DOCUMENTS

| | | |
|---|---|---|
| CN | 104331105 A | 2/2015 |
| CN | 104345825 A | 2/2015 |
| CN | 104735963 A | 6/2015 |
| TW | 201327119 A | 7/2013 |

OTHER PUBLICATIONS

International Search Report and Written Opinion of the International Searching Authority for international application No. PCT/CN2015/089444, dated Dec. 24, 2015.

* cited by examiner

HEAT DISSIPATION DEVICE AND WORKING METHOD THEREOF, DISPLAY DEVICE

CROSS-REFERENCE TO RELATED APPLICATION

This application is the U.S. national phase of PCT Application No. PCT/CN2015/089444 filed on Sep. 11, 2015, which claims priority to Chinese Patent Application No. 201510150329.0 filed on Mar. 31, 2015, the disclosures of which are incorporated in their entirety by reference herein.

TECHNICAL FIELD

The present disclosure relates to the field of display technology, and in particular to a heat dissipation device and a working method thereof and a display device.

BACKGROUND

When using a display device, the display device may work in a high-temperature environment sometimes, and the display device itself may generate heat when working, however, a high environment temperature may influence normal working of the display device. In order to reduce the environment temperature of the display device, according to the related art, several heat dissipation fans are arranged in the display device so as to dissipate heat by air cooling. In one hand, it is required to arrange as many heat dissipation fans as possible so as to dissipate the heat more effectively; in another hand, it may make too much noise of the display device that too many heat dissipation fans are arranged, and a power consumption of the display device may be increased.

SUMMARY

An object of the present disclosure is to provide a heat dissipation device and a working method thereof and a display device, whereby an amount of the heat dissipation fans may be reduced, a noise of the display device may be reduced, and a power consumption of the display device may be reduced while guaranteeing a heat dissipation effect at least.

In view of this, the technical scheme provided by the embodiment of the present disclosure is described as follows.

In one aspect, a heat dissipation device is provided, applied to a display device, including: a temperature monitoring unit, configured to monitor an environment temperature of each predetermined region of the display device; a control unit, connected to the temperature monitoring unit and configured to determine regions to be cooled according to a monitoring result of the temperature monitoring unit and then send a control instruction to a movement unit; the movement unit, connected to the control unit, and configured to move at least one heat dissipation fan to the regions to be cooled in response to the received control instruction; and the at least one heat dissipation fan connected to the movement unit.

Furthermore, the temperature monitoring unit includes a plurality of temperature sensors corresponding to the predetermined regions in a one-to-one manner.

Furthermore, the temperature monitoring unit and the control unit are connected to each other via a general input/output interface.

Furthermore, the control unit includes: a comparison module, configured to compare the environment temperatures of the predetermined regions detected by the temperature monitoring unit with a predetermined threshold value, and determine the predetermined regions of which the environment temperatures are higher than the predetermined threshold value as high-temperature regions; a processing module, configured to determine all the high-temperature regions as the regions to be cooled when an amount of the high-temperature regions is not larger than an amount M of the at least one heat dissipation fan; configured to rank priorities of all the high-temperature regions according to the environment temperatures of the high-temperature regions and/or importance thereof and determine the M high-temperature regions with the highest priorities as the regions to be cooled when the amount of the high-temperature regions is larger than the amount M of the at least one heat dissipation fan.

Furthermore, the movement unit includes: a mechanical arm, configured to move the at least one heat dissipation fan; an electric motor, configure to drive the mechanical arm to move.

Furthermore, the movement unit includes: a guide rail running through all the predetermined regions; at least one sliding block arranged on the guide rail and corresponding to the at least one heat dissipation fan in a one-to-one manner; wherein the at least one heat dissipation fan is fixed at the corresponding sliding block; and an electric motor configured to drive the at least one sliding block to move.

A display device is further provided by one embodiment of the present disclosure, including the heat dissipation device hereinabove.

A working method of the heat dissipation device hereinabove is further provided by one embodiment of the present disclosure, including: monitoring by the temperature monitoring unit, an environment temperature of each predetermined region of the display device; determining by the control unit, regions to be cooled according to a monitoring result of the temperature monitoring unit and then sending a control instruction to the movement unit; and moving by the movement unit, the at least one heat dissipation fan to the regions to be cooled in response to the received control instruction.

Furthermore, the step of determining regions to be cooled according to a monitoring result of the temperature monitoring unit by the control unit includes: comparing the environment temperatures of the predetermined regions detected by the temperature monitoring unit with a predetermined threshold value, and determining the predetermined regions of which the environment temperatures are higher than the predetermined threshold value as high-temperature regions; determining all the high-temperature regions as the regions to be cooled when an amount of the high-temperature regions is not larger than an amount M of the at least one heat dissipation fan; ranking priorities of all the high-temperature regions according to the environment temperatures of the high-temperature regions and/or importance thereof and determining the M high-temperature regions with the highest priorities as the regions to be cooled when the amount of the high-temperature regions is larger than the amount M of the at least one heat dissipation fan.

Furthermore, the step of moving by the movement unit the at least one heat dissipation fan to the regions to be cooled in response to the received control instruction includes: driving by the electric motor, the mechanical arm to move and then moving the at least one heat dissipation fan to the regions to be cooled by the mechanical arm; or driving by the electric motor, the at least one sliding block to move and then moving the at least one heat dissipation fan fixed at the at least one sliding block to the regions to be cooled.

The embodiments of the present disclosure have at least the following advantages: according to the technical scheme hereinabove, the temperature monitoring unit monitors the environment temperature of each predetermined region of the display device, the control unit determines the regions to be cooled with high environment temperatures according to the monitoring result of the temperature monitoring unit and then send the control instruction to the movement unit, and the movement unit moves the heat dissipation fans to the regions to be cooled in response to the received control instruction. By the technical scheme of the present disclosure, an amount of the heat dissipation fans may be reduced, a noise of the display device may be reduced, and a power consumption of the display device may be reduced while guaranteeing a heat dissipation effect.

DETAILED DESCRIPTION

To make an objective, a technical scheme and advantages of the present disclosure more clear, the present disclosure may be described in details in conjunction with drawings and embodiments.

A heat dissipation device, a working method thereof and a display device are provided by embodiments of the present disclosure, by which an amount of heat dissipation fans may be reduced, a noise of the display device may be reduced, and a power consumption of the display device may be reduced while guaranteeing a heat dissipation effect.

Embodiment One

Figure 1:
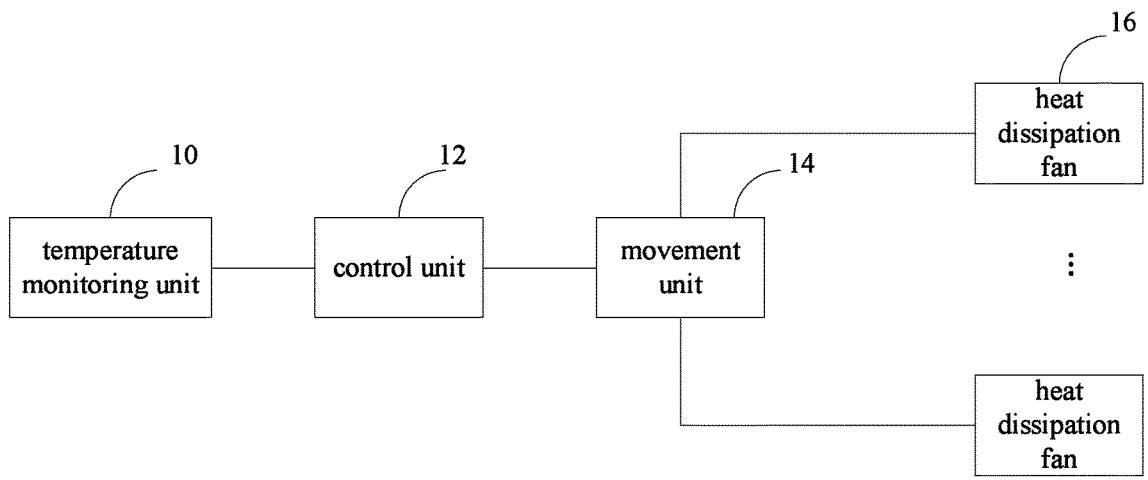
FIG. 1 is a schematic view showing a heat dissipation device provided by one embodiment of the present disclosure.
Figure 3:
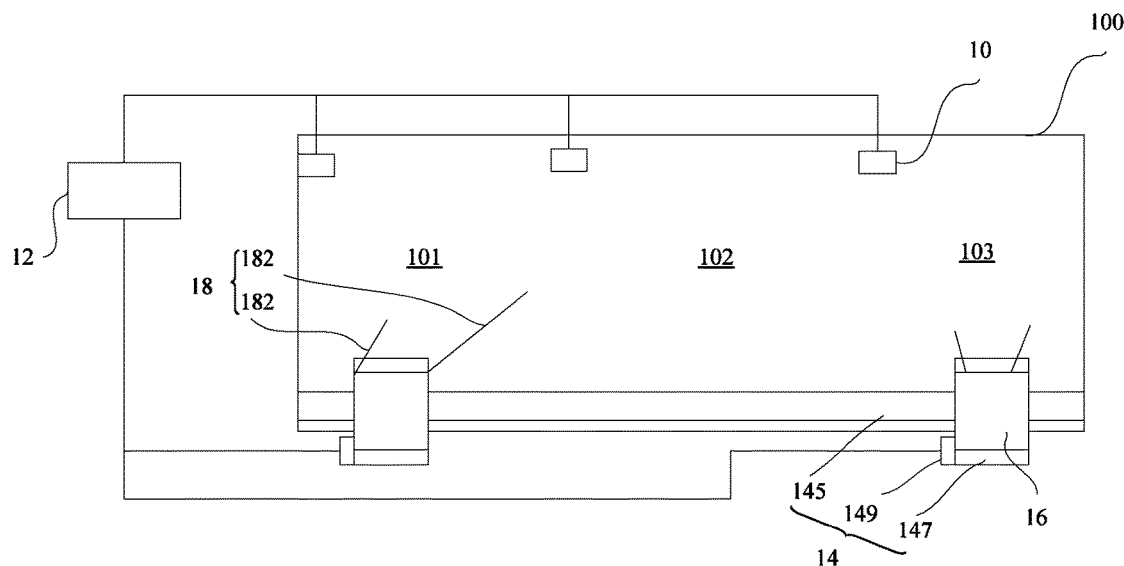
FIG. 3 is a schematic view showing a structure of the heat dissipation device provided by one embodiment of the present disclosure.

A heat dissipation device is provided by the embodiment, applied to a display device. As shown in FIG. 1 and FIG. 3, the heat dissipation device provided by the embodiment includes: a temperature monitoring unit 10 configured to monitor an environment temperature of each of predetermined regions 101, 102 and 103 of the display device 100; a control unit 12, connected to the temperature monitoring unit 10 and configured to determine regions to be cooled according to a monitoring result of the temperature monitoring unit 10 and then send a control instruction to a movement unit 14; the movement unit 14, connected to the control unit 12 and configured to move the heat dissipation fans to the regions to be cooled in response to the received control instruction; and at least one heat dissipation fan 16 connected to the movement unit 14.

According to this embodiment, the temperature monitoring unit monitors the environment temperature of each predetermined region of the display device, the control unit determines the regions to be cooled with high environment temperatures according to the monitoring result of the temperature monitoring unit and then send the control instruction to the movement unit, and the movement unit moves the heat dissipation fans to the regions to be cooled in response to the received control instruction. By the technical scheme of the present disclosure, an amount of the heat dissipation fans may be reduced, a noise of the display device may be reduced, and a power consumption of the display device may be reduced while guaranteeing a heat dissipation effect.

To be specific, the temperature monitoring unit 10 may include a plurality of temperature sensors corresponding to the predetermined regions in a one-to-one manner. The environment temperature of each predetermined region of the display device is monitored by the temperature sensor arranged in each predetermined region of the display device.

The temperature monitoring unit 10 and the control unit 12 may be connected to each other via a general input/output interface. The temperature monitoring unit 10 sends, via the general input/output interface, environment temperature data detected by the temperature sensors to the control unit 12, such that the control unit 12 determines the regions to be cooled according to the received environment temperature data.

To be specific, the control unit 12 may include a comparison module and a processing module. The comparison module is configured to compare the environment temperatures of the predetermined regions detected by the temperature monitoring unit 10 with a predetermined threshold value, and determine the predetermined regions with the environment temperatures being higher than the predetermined threshold value as high-temperature regions. The processing module is configured to determine all the high-temperature regions as the regions to be cooled when an amount of the high-temperature regions is not larger than an amount M of the heat dissipation fans, and configured to rank priorities of all the high-temperature regions according to the environment temperatures of the high-temperature regions and/or importance thereof and determine the M high-temperature regions with the highest priorities as the regions to be cooled when the amount of the high-temperature regions is larger than the amount M of the heat dissipation fans.

In this way, when the amount of the high-temperature regions is not larger than the amount M of the heat dissipation fans, all the high-temperature regions may be cooled by the heat dissipation fans. When the amount of the high-temperature regions is larger than the amount M of the heat dissipation fans, the high-temperature regions with higher environment temperatures or which are more important may be cooled by the heat dissipation fans, so as to cool the high-temperature regions more effectively with a limited amount of the heat dissipation fans.

Figure 4:
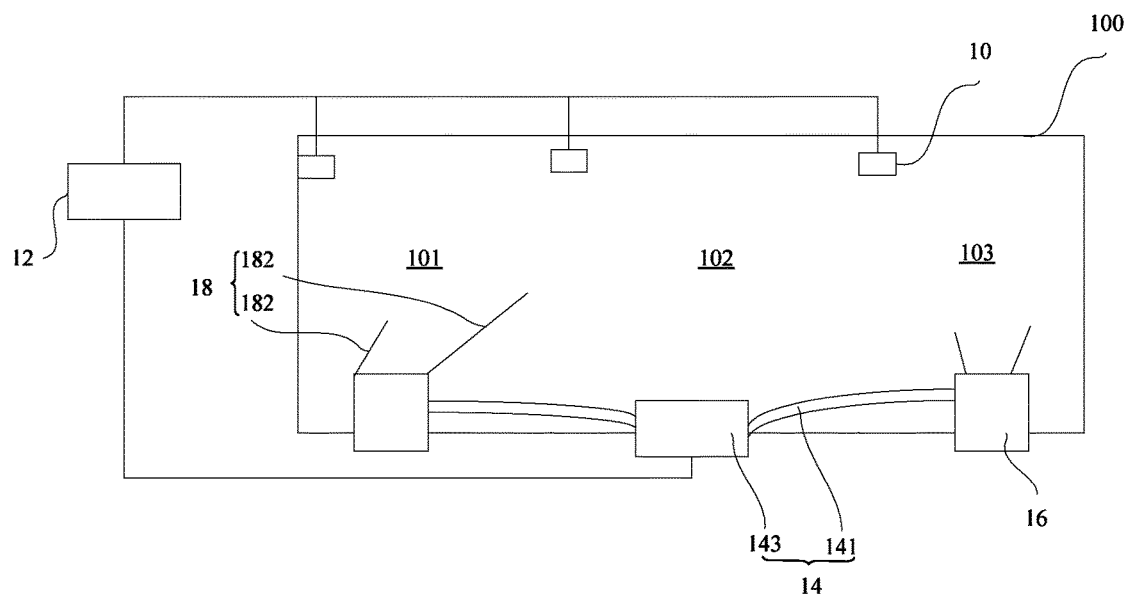
FIG. 4 is a schematic view showing another structure of the heat dissipation device provided by one embodiment of the present disclosure.

After the control unit 12 determines the regions to be cooled, the movement unit 14 moves the heat dissipation fans to the regions to be cooled. The movement unit may be implemented in several ways. In one embodiment, the movement unit 14 may include: a mechanical arm 141 configured to move the heat dissipation fans and an electric motor 143 configured to drive the mechanical arm 141 to move. As shown in FIG. 4, the electric motor 143 drives the mechanical arm 141 to move so as to move the heat dissipation fans to the regions to be cooled. In another embodiment, as shown in FIG. 4, the movement unit 14 may include a guide rail 145 running through all the predetermined regions, sliding blocks 147 arranged on the guide rail 145 and corresponding to the heat dissipation fans in a one-to-one manner, and an electric motor 149 configured to drive the sliding blocks 147 to move. The heat dissipation fans are fixed at the corresponding sliding blocks 147. The electric motor 149 drives the sliding blocks 147 to move so as to move the heat dissipation fans to the regions to be cooled.

It should be noted that, FIG. 3 and FIG. 4 merely show three predetermined regions schematically (i.e., the predetermined region 101, the predetermined region 102 and the predetermined region 103). In a practical application, the predetermined regions may be determined according to actual conditions, i.e., there may be 2, 4 or more predetermined regions.

Embodiment Two

A display device is further provided by the embodiment of the present disclosure, including the heat dissipation device hereinabove. In order to coordinate with the heat dissipation device, a wind-path structure 18 corresponding to the heat dissipation fan is further arranged in the display device. As shown in FIG. 3, the wind-path structure 18 enables wind blowing from the heat dissipation fans to flow along a predetermined direction, such that when cooling the regions to be cooled, the wind may further cool the other regions which the wind runs through, thereby further improving heat dissipation effects.

The wind-path structure 18 may be implemented as block slices 182 arranged at two sides of a wind outlet side of the heat dissipation fan, and the wind blowing from the heat dissipation fan may flow along a direction defined by the block slices 182. Of course, the wind-path structure is not limited to the block slices, which may be of any structure as long as the wind blowing from the heat dissipation fan may be guided to flow along a predetermined direction.

Embodiment Three

Figure 2:
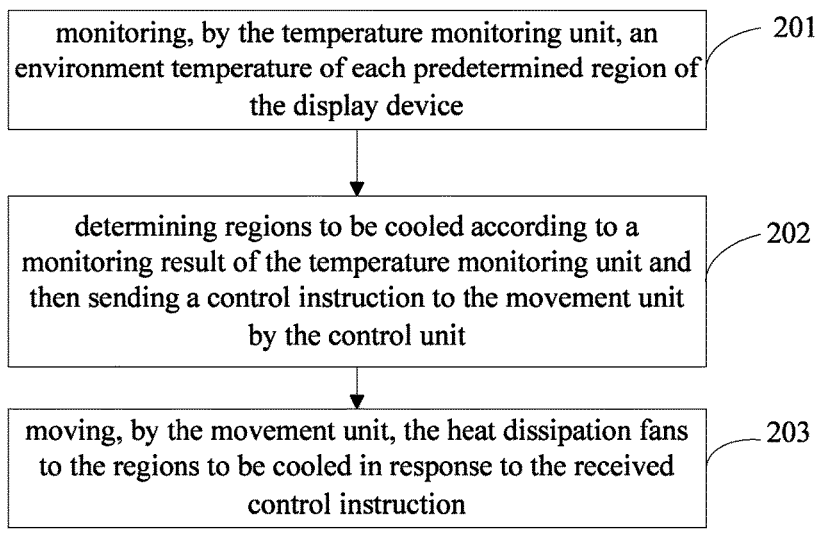
FIG. 2 is a flow chart of a working method of the heat dissipation device provided by one embodiment of the present disclosure.

A working method of the heat dissipation device is provided by one embodiment of the present disclosure. As shown in FIG. 2, the working method includes:

Step 201: monitoring, by the temperature monitoring unit, an environment temperature of each predetermined region of the display device;

Step 202: determining, by the control unit, regions to be cooled according to a monitoring result of the temperature monitoring unit and then sending a control instruction to the movement unit; and Step 203: moving, by the movement unit, the heat dissipation fans to the regions to be cooled in response to the received control instruction.

According to this embodiment, the temperature monitoring unit monitors the environment temperature of each predetermined region of the display device, the control unit determines the regions to be cooled with high environment temperatures according to the monitoring result of the temperature monitoring unit and then send the control instruction to the movement unit, and the movement unit moves the heat dissipation fans to the regions to be cooled in response to the received control instruction. By the technical scheme of the present disclosure, an amount of the heat dissipation fans may be reduced, a noise of the display device may be reduced, and a power consumption of the display device may be reduced while guaranteeing a heat dissipation effect.

To be specific, the step of determining regions to be cooled according to a monitoring result of the temperature monitoring unit by the control unit includes:

comparing environment temperatures of the predetermined regions detected by the temperature monitoring unit with a predetermined threshold value, and determining the predetermined regions of which the environment temperatures are higher than the predetermined threshold value as high-temperature regions;

determining all the high-temperature regions as the regions to be cooled when an amount of the high-temperature regions is not larger than an amount M of the heat dissipation fans; ranking priorities of all the high-temperature regions according to the environment temperatures of the high-temperature regions and/or importance thereof and determining the M high-temperature regions with the highest priorities as the regions to be cooled when the amount of the high-temperature regions is larger than the amount M of the heat dissipation fans.

In this way, when the amount of the high-temperature regions is not larger than the amount M of the heat dissipation fans, all the high-temperature regions may be cooled by the heat dissipation fans. When the amount of the high-temperature regions is larger than the amount M of the heat dissipation fans, the high-temperature regions with higher environment temperatures or which are more important may be cooled, so as to cool the high-temperature regions more effectively with a limited amount of the heat dissipation fans.

Furthermore, when the movement unit includes the mechanical arm configured to move the heat dissipation fans and the electric motor configured to drive the mechanical arm to move, the step of moving by the movement unit the heat dissipation fans to the regions to be cooled includes: driving by the electric motor the mechanical arm to move and then moving the heat dissipation fans to the regions to be cooled by the mechanical arm.

Furthermore, when the movement unit includes the guide rail running through all the predetermined regions, the sliding blocks arranged on the guide rail and corresponding to the heat dissipation fans in a one-to-one manner and the electric motor configured to drive the sliding blocks to move, the step of moving by the movement unit the heat dissipation fans to the regions to be cooled includes: driving by the electric motor the sliding blocks to move and then moving the heat dissipation fans fixed at the sliding blocks to the regions to be cooled.

Embodiment Four

The heat dissipation device and the working method thereof may be described hereinafter in details in conjunction with embodiments.

In many display devices, in order to cool key components in the display device, it is required to use several or many heat dissipation fans to cool the key components. However, it may make too much noise of the display device that too many heat dissipation fans are arranged, and a power consumption of the display device may be increased.

In view of this, a heat dissipation device arranged in a display device is provided by one embodiment of the present disclosure, including a temperature monitoring unit, a control unit, a movement unit, and at least one heat dissipation fan. The temperature monitoring unit includes a plurality of temperature sensors which divide the display device into a plurality of predetermined regions, and one temperature sensor is arranged in one corresponding predetermined region. An environment temperature of the predetermined region is monitored by the corresponding temperature sensor. The control unit is connected to the temperature monitoring unit, is configured to determine regions to be cooled according to a monitoring result of the temperature monitoring unit and then send a control instruction to the movement unit to instruct the movement unit to move the heat dissipation fans to the regions to be cooled. The movement unit is connected to the control unit, and is configured to move the heat dissipation fans to the regions to be cooled in response to the received control instruction.

To be specific, after receiving the environment temperature of each predetermined region of the display device sent by the temperature monitoring unit, the control unit compares the environment temperature of each predetermined region with a predetermined threshold value. If the environment temperature of a certain predetermined region is larger than the threshold value, this predetermined region may be determined as a high-temperature region. The space within the display device is limited, so the amount of the heat dissipation fans that can be arranged is also limited. In order to achieve a good cooling effect with the limited amount of the heat dissipation fans, when an amount of the high-temperature regions is larger than an amount M of the heat dissipation fans, the control unit ranks priorities of all the high-temperature regions according to the environment temperatures of the high-temperature regions and importance thereof and determines the M high-temperature regions with the highest priorities as the regions to be cooled, and then the control unit sends a control instruction to the movement unit to instruct the movement unit to move the heat dissipation fans to the regions to be cooled.

The movement unit may move the heat dissipation fans in several ways. To be specific, the movement unit may include a mechanical arm and an electric motor. The mechanical arm is driven by the electric motor to move and then the heat dissipation fan is moved by the mechanical arm to the region to be cooled. Alternatively, a guide rail running through all the predetermined regions is arranged, and at least one sliding block is arranged on the guide rail. The heat dissipation fans are fixed at the corresponding sliding blocks, and the sliding blocks are driven to move by the electric motor and then the heat dissipation fans are moved to the regions to be cooled.

When using the heat dissipation fans to cool the regions to be cooled, the temperature monitoring unit still monitors the environment temperature of each predetermined region. The control unit receives temperature data sent by the temperature monitoring unit every predetermined time period and determines the regions to be cooled at the current time period according to the received temperature data. If the environment temperature of one region to be cooled which is determined in the previous time period is reduced to be lower than the threshold value, the heat dissipation fan arranged for the one region may be moved to one region to be cooled which is determined in the current time period.

According to this embodiment, the temperature of each predetermined region is monitored, and positions of the heat dissipation fans may be adjusted according to the detected environment temperatures, thereby the amount of the heat dissipation fans may be reduced, a noise of the display device may be reduced, and a power consumption of the display device may be reduced while guaranteeing a heat dissipation effect.

Many functional components described in this specification are referred to as units, so as to emphasize an independence of the implementation of these components.

According to the embodiment of the present disclosure, the unit may be implemented by software for various types of processors to process. For example, an identified executable code unit may include one or more physical or logical blocks of a computer instruction. For example, the identified executable code unit may be constructed as an object, a process or a function. However, executable codes of the identified units are not needed to get together, which may include different instructions stored at different physical positions. When the instructions are combined logically, they form a unit and implement a specified objective thereof.

Actually, the executable code unit may be a single instruction or a plurality of instructions, and they may even be distributed in different code segments different programs and distributed across a plurality of storages. Similarly, operation data may be identified in the unit, implemented in any suitable ways, and organized in data structure of any suitable type. The operation data may be collected as a single data set, or distributed at different positions (including different storages devices), and stored in a system or a network partially only as electrical signals.

When the unit is implemented by software, in view of the existing hardware process level, a person skilled in the art may set up a corresponding hardware circuit for the units which can be implemented by software so as to realize the corresponding function without concerning the cost. The hardware circuit includes a conventional very large scale integrated circuit (VLSL) or a gate array, and a semiconductor or the other separated components in the related art such as logical chip and transistor. The unit may further be implemented by a programmable hardware device such as field-programmable gate array, programmable array logic and programmable logical device.

In the method embodiments of the present disclosure, a sequence of the steps is not limited by the numbers of the steps and a change of the sequence of the steps made by those skilled in the art without any creative work may also fall into the scope of the present disclosure.

The above are merely the preferred embodiments of the present disclosure. It should be noted that, a person skilled in the art may make further modifications and improvements without departing from the principle/spirit of the present disclosure, and these modifications and improvements shall also fall within the scope of the present disclosure.

What is claimed is:

1. A heat dissipation device, applied to a display device, comprising a temperature monitoring unit, a control unit, a movement unit, and a plurality of heat dissipation fans, wherein:
   the temperature monitoring unit monitors an environment temperature of each predetermined region of the display device;
   the control unit is connected to the temperature monitoring unit, and determines to-be-cooled regions according to a monitoring result of the temperature monitoring unit and then send a control instruction to the movement unit, wherein the control unit determines the to-be-cooled regions by:
   comparing the environment temperatures of the predetermined regions detected by the temperature monitoring unit with a predetermined threshold value, and determine the predetermined regions of which the environment temperatures are higher than the predetermined threshold value as high-temperature regions;
   determining all the high-temperature regions as the to-be-cooled regions when an amount of the high-temperature regions is not larger than an amount M of the plurality of heat dissipation fans; and
   ranking priorities of all the high-temperature regions according to the environment temperatures of the high-temperature regions and/or importance thereof and determine M high-temperature regions with highest priority as the to-be-cooled regions when the amount of the high-temperature regions is larger than the amount M of the plurality of heat dissipation fans;

the movement unit is connected to the control unit, and moves the plurality of heat dissipation fans to the to-be-cooled regions to be cooled in response to the control instruction; and the plurality of heat dissipation fans are connected to the movement unit.

2. The heat dissipation device according to claim 1, wherein the temperature monitoring unit comprises a plurality of temperature sensors corresponding to the predetermined regions in a one-to-one manner.

3. The heat dissipation device according to claim 1, wherein the temperature monitoring unit and the control unit are connected to each other via a general input/output interface.

4. The heat dissipation device according to claim 1, wherein the movement unit comprises:
a mechanical arm, configured to move the plurality of heat dissipation fans to the to-be-cooled regions; and
an electric motor, configure to drive the mechanical arm to move.

5. The heat dissipation device according to claim 1, wherein the movement unit comprises:
a guide rail running through all the predetermined regions;
at least one sliding blocks arranged on the guide rail and corresponding to the plurality of heat dissipation fans in a one-to-one manner; wherein the plurality of heat dissipation fans are fixed at the corresponding sliding blocks, respectively; and
an electric motor configured to drive the sliding blocks to move.

6. A display device, comprising a heat dissipation device, wherein:
the heat dissipation device comprises a temperature monitoring unit, a control unit, a movement unit, and a plurality of heat dissipation fans;
the temperature monitoring unit monitors an environment temperature of each predetermined region of the display device;
the control unit is connected to the temperature monitoring unit, and determines to-be-cooled regions according to a monitoring result of the temperature monitoring unit and then send a control instruction to the movement unit, wherein the control unit determines the to-be-cooled regions by:
comparing the environment temperatures of the predetermined regions detected by the temperature monitoring unit with a predetermined threshold value, and determine the predetermined regions of which the environment temperatures are higher than the predetermined threshold value as high-temperature regions;
determining all the high-temperature regions as the to-be-cooled regions when an amount of the high-temperature regions is not larger than an amount M of the plurality of heat dissipation fans; and
ranking priorities of all the high-temperature regions according to the environment temperatures of the high-temperature regions and/or importance thereof and determine M high-temperature regions with highest priority as the to-be-cooled regions when the amount of the high-temperature regions is larger than the amount M of the plurality of heat dissipation fans;

the movement unit is connected to the control unit, and moves the plurality of heat dissipation fans to the to-be-cooled regions in response to the control instruction; and the plurality of heat dissipation fans are connected to the movement unit.

7. A working method of a heat dissipation device, the heat dissipation device including a temperature monitoring unit, a control unit, a movement unit and a plurality of heat dissipation fans, the control unit being connected to the temperature monitoring unit, the movement unit being connected to the control unit, and the plurality of heat dissipation fans being connected to the movement unit, the working method comprising:
monitoring by the temperature monitoring unit, an environment temperature of each predetermined region of a display device;
determining by the control unit, to-be-cooled regions according to a monitoring result of the temperature monitoring unit and then sending a control instruction to the movement unit, wherein the step of determining the to-be-cooled regions comprises:
comparing the environment temperatures of the predetermined regions detected by the temperature monitoring unit with a predetermined threshold value, and determining the predetermined regions of which the environment temperatures are higher than the predetermined threshold value as high-temperature regions;
determining all the high-temperature regions as the regions to-be-cooled when an amount of the high-temperature regions is not larger than an amount M of the at least one heat dissipation fan; and
ranking priorities of all the high-temperature regions according to the environment temperatures of the high-temperature regions and/or importance thereof and determining the M high-temperature regions with the highest priorities as the regions to-be-cooled when the amount of the high-temperature regions is larger than the amount M of the at least one heat dissipation fan; and
moving by the movement unit, the plurality of heat dissipation fans to the to-be-cooled regions in response to the control instruction.

8. The working method according to claim 7, wherein the movement unit comprises a mechanical arm configured to move the plurality of heat dissipation fans, and an electric motor configure to drive the mechanical arm to move;
wherein the moving by the movement unit the plurality of heat dissipation fans to the to-be-cooled regions in response to the control instruction comprises: driving by the electric motor, the mechanical arm to move and then moving the plurality of heat dissipation fans to the to-be-cooled regions by the mechanical arm.

9. The display device according to claim 6, wherein the temperature monitoring unit comprises a plurality of temperature sensors corresponding to the predetermined regions in a one-to-one manner.

10. The display device according to claim 6, wherein the temperature monitoring unit and the control unit are connected to each other via a general input/output interface.

11. The display device according to claim 6, wherein the movement unit comprises:
a mechanical arm, configured to move the plurality of heat dissipation fans to the to-be-cooled regions; and
an electric motor, configure to drive the mechanical arm to move.

12. The display device according to claim 6, wherein the movement unit comprises:
a guide rail running through all the predetermined regions;
sliding blocks arranged on the guide rail and corresponding to the plurality of heat dissipation fans in a one-to-one manner; wherein the plurality of heat dissipation fans are fixed at the corresponding sliding blocks, respectively; and
an electric motor configured to drive the sliding blocks to move.

13. The method according to claim 7, wherein the movement unit comprises:
a guide rail running through all the predetermined regions;
sliding blocks arranged on the guide rail and corresponding to the plurality of heat dissipation fans in a one-to-one manner; wherein the plurality of heat dissipation fans are fixed at the corresponding sliding blocks, respectively; and
an electric motor configured to drive the sliding blocks to move,
wherein the moving by the movement unit the plurality of heat dissipation fans to the to-be-cooled regions in response to the control instruction comprises: driving by the electric motor, the sliding blocks to move and then moving the plurality of heat dissipation fans fixed at the sliding blocks to the to-be-cooled regions.

14. The working method according to claim 7, wherein the temperature monitoring unit comprises a plurality of temperature sensors corresponding to the predetermined regions in a one-to-one manner.

15. The working method according to claim 7, wherein the temperature monitoring unit and the control unit are connected to each other via a general input/output interface.

16. The heat dissipation device according to claim 1, further comprising a wind-path structure arranged at a wind outlet side of each of the plurality of heat dissipation fans.

17. The heat dissipation device according to claim 16, wherein the wind-path structure comprises block slices arranged at two sides of the wind outlet side of each of the plurality of heat dissipation fans.

18. The display device according to claim 6, further comprising a wind-path structure arranged in each of the plurality of heat dissipation fans.

19. The display device according to claim 18, wherein the wind-path structure comprises block slices arranged at two sides of a wind outlet side of each of the plurality of heat dissipation fans.

* * * * *